(12) United States Patent
Shi et al.

(10) Patent No.: US 8,487,429 B2
(45) Date of Patent: Jul. 16, 2013

(54) ASSEMBLY OF MULTI-CHIP MODULES USING SACRIFICIAL FEATURES

(75) Inventors: Jing Shi, Carlsbad, CA (US); David C. Douglas, Palo Alto, CA (US)

(73) Assignee: Oracle America, Inc., Redwood Shores, CA (US)

( * ) Notice: Subject to any disclaimer, the term of this patent is extended or adjusted under 35 U.S.C. 154(b) by 471 days.

(21) Appl. No.: 12/564,822

(22) Filed: Sep. 22, 2009

(65) Prior Publication Data

US 2011/0068479 A1 Mar. 24, 2011

(51) Int. Cl.
*H01L 23/34* (2006.01)
(52) U.S. Cl.
USPC ....... 257/727; 257/686; 257/704; 257/E23.18
(58) Field of Classification Search
USPC .................. 257/726, 686, 704, 727, E23.18
See application file for complete search history.

(56) References Cited

U.S. PATENT DOCUMENTS 7,893,531 B2 * 2/2011 Mitchell et al. ............... 257/727

OTHER PUBLICATIONS

Beyne, Eric et al., "3D System Integration Technologies", pp. 1-3, IEEE 2007.
Okinaga, Nobuyuki et al., "Excellent Reliability of Solder Ball Made of a Compliant Plastic Core", pp. 1-5, 2001 Electronic Components and Technology Conference.

* cited by examiner

*Primary Examiner* — Jenny L Wagner
(74) *Attorney, Agent, or Firm* — Park, Vaughan, Fleming & Dowler, LLP; Steven E. Stupp

(57) ABSTRACT

A multi-chip module (MCM) is described. This MCM includes two substrates, having facing surfaces, which are mechanically coupled. Disposed on a surface of a first of these substrates, there is a negative feature, which is recessed below this surface. A positive feature in the MCM, which includes an assembly material other than a bulk material in the substrates, at least in part mates with the negative feature. For example, the positive feature may be disposed on the surface of the other substrate. Alternatively, prior to assembly of the MCM, the positive feature may be a separate component from the substrates (such as a micro-sphere). Note that the assembly material has a bulk modulus that is less than a bulk modulus of the material in the substrates. Furthermore, at least a portion of the positive feature may have been sacrificed when the mechanical coupling was established.

17 Claims, 7 Drawing Sheets

— 600

```
┌─────────────────────────────────────────────────────────────┐
│  DEFINE A NEGATIVE FEATURE IN AT LEAST ONE OF A FIRST       │
│  SURFACE OF A FIRST SUBSTRATE AND A SECOND SURFACE OF A     │
│  SECOND SUBSTRATE                                           │
│  610                                                        │
└─────────────────────────────────────────────────────────────┘
                              │
                              ▼
┌─────────────────────────────────────────────────────────────┐
│  STACK THE FIRST SUBSTRATE AND THE SECOND SUBSTRATE SO      │
│  THAT THE FIRST SURFACE AND THE SECOND SURFACE ARE          │
│  FACING EACH OTHER                                          │
│  612                                                        │
│  ┌───────────────────────────────────────────────────────┐  │
│  │  POSITION A POSITIVE FEATURE IN AN MCM RELATIVE TO    │  │
│  │  THE NEGATIVE FEATURE SO THAT THE POSITIVE FEATURE,   │  │
│  │  AT LEAST IN PART, MATES WITH THE NEGATIVE FEATURE,   │  │
│  │  WHERE THE POSITIVE FEATURE INCLUDES A MATERIAL       │  │
│  │  HAVING A BULK MODULUS THAT IS LESS THAN A BULK       │  │
│  │  MODULUS OF THE FIRST SUBSTRATE AND THE BULK          │  │
│  │  MODULUS OF THE SECOND SUBSTRATE                      │  │
│  │  614                                                  │  │
│  └───────────────────────────────────────────────────────┘  │
└─────────────────────────────────────────────────────────────┘
                              │
                              ▼
┌─────────────────────────────────────────────────────────────┐
│  ALIGN THE FIRST SUBSTRATE AND THE SECOND SUBSTRATE BY      │
│  SACRIFICING AT LEAST A PORTION OF THE POSITIVE FEATURE,    │
│  WHERE AT LEAST THE PORTION OF THE POSITIVE FEATURE         │
│  INCLUDES THE MATERIAL                                      │
│  616                                                        │
│  ┌───────────────────────────────────────────────────────┐  │
│  │  MECHANICALLY COMPRESS AT LEAST THE PORTION OF THE    │  │
│  │  POSITIVE FEATURE AND/OR MELT AT LEAST THE PORTION    │  │
│  │  OF THE POSITIVE FEATURE                              │  │
│  │  (OPTIONAL)                                           │  │
│  │  618                                                  │  │
│  └───────────────────────────────────────────────────────┘  │
└─────────────────────────────────────────────────────────────┘
```

FIG. 6

ASSEMBLY OF MULTI-CHIP MODULES USING SACRIFICIAL FEATURES

BACKGROUND

1. Field

The present disclosure generally relate to a multi-chip modules (MCMs) for semiconductor chips. More specifically, the present disclosure relates to an MCM that includes features that are at least partially sacrificed during assembly of the MCM.

2. Related Art

Three dimensional (3D) chip stacking using through-silicon-vias (TSVs) is an important area of research in developing future high-density, high-performance multi-chip systems. In existing 3D chip stacking TSV techniques, chip-to-wafer and/or chip-to-chip bonding remains a challenging operation because of problems in attaining ultra-high alignment accuracy and high-throughput manufacturing. These difficulties are expected to increase in future multi-chip systems.

For example, in proposed multi-chip systems, die stacking is expected to be implemented in the metal layers below the top metal bond pads, and the target pad size/pitch is expected to decrease from 50-200 µm to 5-10 µm. Furthermore, in order to achieve an all-copper interconnect solution, future multi-chip systems will likely use inter-die stacking between copper nails and copper pads. These techniques are expected to require higher in-plane alignment accuracy, as well as higher co-planarity, than in existing multi-chip systems.

However, existing flip-chip bonders, which can achieve an accuracy of ±1-3 µm, usually have poor manufacturing throughput. Similarly, other alignment techniques that ensure high bonding accuracy are typically not suitable for use in high-volume manufacturing because of the long time needed to bond a single chip. Indeed, low manufacturing throughput often makes bonding one of the most expensive process operations when fabricating TSVs, which, in turn, increases the cost of the resulting multi-chip systems.

Hence, what is needed is a technique for fabricating a multi-chip system without the above-described problems.

SUMMARY

One embodiment of the present disclosure provides a multi-chip module (MCM) that includes a first substrate having a first surface, and a second substrate having a second surface. The first surface is mechanically coupled to the second surface, thereby aligning the first substrate and the second substrate. This mechanical coupling is facilitated by a negative feature recessed below at least one of the first surface and the second surface. Moreover, the negative feature has an opening, defined by an edge, in at least one of the first surface and the second surface. Furthermore, the mechanical coupling is facilitated by a positive feature in the MCM that includes a first material other than a bulk material in the first substrate and the second substrate. Note that this positive feature at least in part mates with the negative feature. In addition, note that the first material has a bulk modulus that is less than a bulk modulus of the first substrate and that is less than a bulk modulus of the second substrate.

In some embodiments, the positive feature includes a spherically shaped coupling component. Moreover, the spherically shaped coupling component may have a core that includes a second material, and an outer shell that includes the first material. Note that the first material may have been, at least in part, sacrificed when the mechanical coupling was established. For example, the first material may have been, at least in part, mechanically compressed and/or melted when the mechanical coupling was established.

Prior to assembly of the MCM, the positive feature may have been a separate component from the first substrate and the second substrate. Alternatively, the negative feature may be defined in the first surface, and the positive feature may be defined on the second surface.

Furthermore, the first surface may include a first negative feature and the second surface may include a second negative feature. The positive feature may mate with the first negative feature and the second negative feature, thereby facilitating the alignment. For example, the first negative feature and the second negative feature may include pits, and the positive feature may include the spherically shaped coupling component.

In some embodiments, the positive feature includes a protrusion from at least one of the first surface and the second surface. This protrusion may include a second material, and may have sides and an upper surface which is substantially parallel to the first surface and the second surface. In addition, the protrusion may include a layer, deposited on the upper surface and/or the sides, which includes the first material.

In some embodiments, the negative feature and/or the positive feature are defined in a dielectric layer deposited on at least one of the first substrate and the second substrate.

Note that the alignment may facilitate electrical coupling of components on the first substrate and the second substrate using a through-silicon via (TSV). Moreover, the bulk modulus of the first material may be less than a bulk modulus of a metal connector in the TSV.

Another embodiment provides an electronic device that includes the MCM.

Another embodiment provides a method for assembling an MCM. During this method, a negative feature is defined in at least one of a first surface of a first substrate and a second surface of a second substrate. Then, the first substrate and the second substrate are stacked, so that the first surface and the second surface are facing each other. Furthermore, while stacking the first substrate and the second substrate, a positive feature in the MCM is positioned relative to the negative feature so that the positive feature, at least in part, mates with the negative feature. Note that the positive feature may include a first material having a bulk modulus that is less than a bulk modulus of the first substrate and that is less than a bulk modulus of the second substrate. Next, the first substrate and the second substrate are aligned by sacrificing at least a portion of the positive feature, where at least the portion of the positive feature includes the first material.

In some embodiments, sacrificing at least the portion of the positive feature involves mechanically compressing at least the portion of the positive feature and/or melting at least the portion of the positive feature.

BRIEF DESCRIPTION OF THE FIGURES

FIG. 6 is a flow chart illustrating a process for assembling an MCM in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Figure 1:
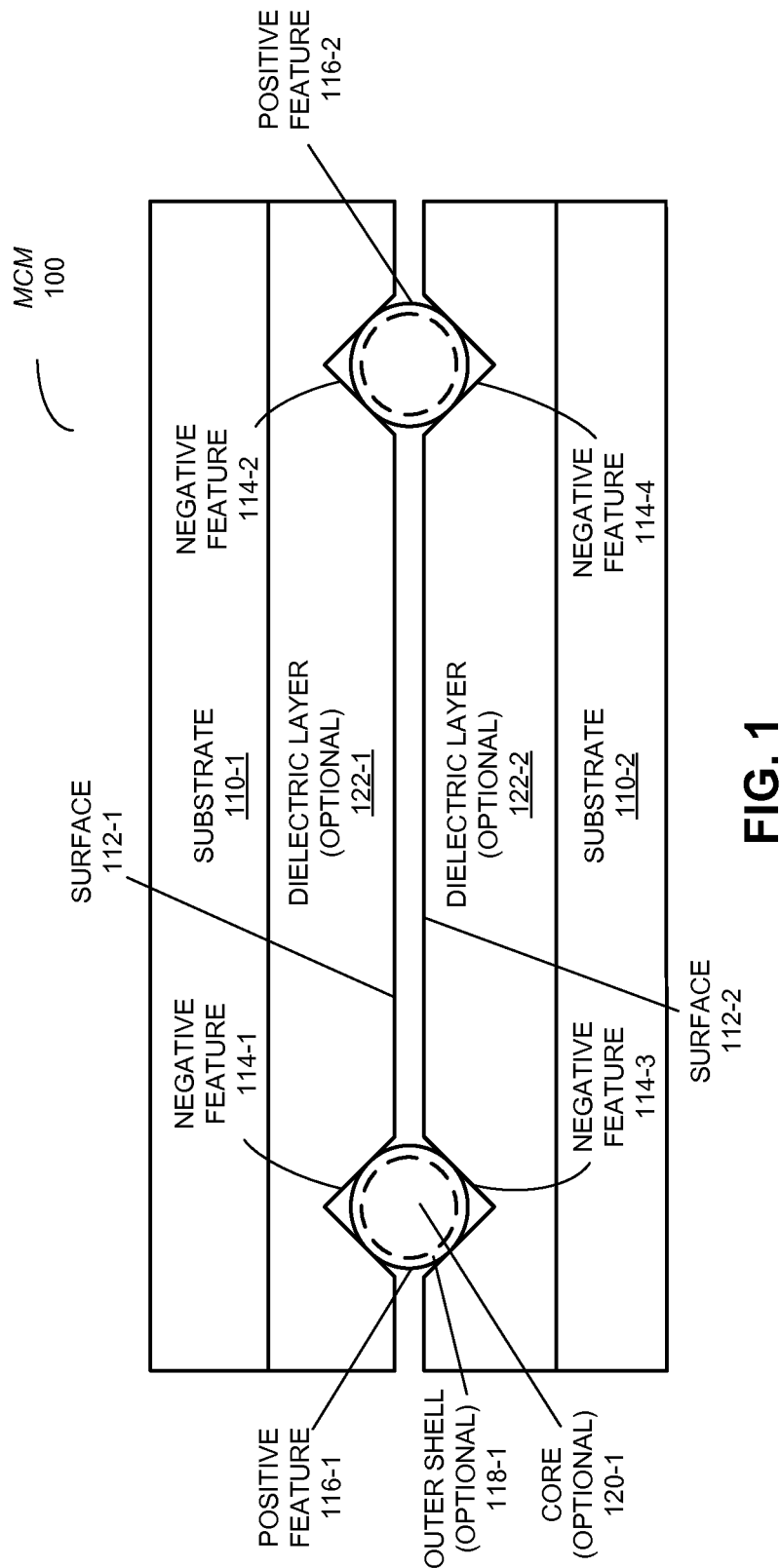
FIG. 1 is a block diagram illustrating a multi-chip module (MCM) in accordance with an embodiment of the present disclosure.

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a multi-chip module (MCM), an electronic device that includes the MCM, and a technique for assembling the MCM are described. This MCM includes two substrates, having facing surfaces, which are mechanically coupled. Disposed on a surface of a first of these substrates, there is a negative feature, which is recessed below this surface. A positive feature in the MCM, which includes an assembly material other than a bulk material in the substrates, at least in part mates with the negative feature. For example, the positive feature may be disposed on the surface of the other substrate. Alternatively, prior to assembly of the MCM, the positive feature may be a separate component from the substrates (such as a micro-sphere). Note that the assembly material has a bulk modulus that is less than a bulk modulus of the material in the substrates. Furthermore, at least a portion of the positive feature may have been sacrificed when the mechanical coupling was established.

By sacrificing at least the portion of the positive feature, this assembly technique may facilitate the integration of multiple chips in the MCM. In particular, relative to existing assembly techniques, the assembly technique may: increase the alignment accuracy, increase the throughput, and/or lower the assembly cost. This may be beneficial in MCMs that include through-silicon vias (TSVs). For example, the vias may be smaller, with lower capacitance and, thus, higher communication bandwidth. In addition, there may be improved manufacturing tolerance, which may reduce yield loss.

We now describe embodiments of an MCM. This MCM is assembled using a highly accurate self-alignment assembly technique that: initially mates positive and negative features (such as balls and pits) in the MCM, which provides accurate alignment in an XY plane of chips in the MCM (i.e., in the plane of the chip surfaces), as well as co-planarity control. Subsequently, at least a portion of the positive features is sacrificed to achieve alignment in the Z direction (i.e., out of the plane of the chip surfaces). For example, the positive features may be mechanically compliant, and the Z-direction alignment may be achieved by compressing the MCM, and thus, the positive features. The resulting stress may result in an irreversible strain or deformation of the positive features.

Alternatively or additionally, at least the portion of the positive features may be sacrificed by heating the positive features above the melting temperature of at least the portion of the positive features.

FIG. 1 presents a block diagram illustrating a cross-sectional view of MCM 100. This MCM includes substrates 110 that have surfaces 112 which face each other. Each of surfaces 112 may include one or more negative features 114, such as pits. A given negative feature, such as negative feature 114-1, may be recessed below the corresponding surface (such as surface 112-1), and may have an opening, defined by an edge. Note that surfaces 112 should be understood to include surfaces of substrates 110 or surfaces of layers deposited on substrates 110.

Furthermore, MCM 100 may include one or more positive features 116 (for example, one or more spherically shaped coupling components, such as micro-spheres or balls) that mate with a given pair of negative features (such as negative features 114-1 and 114-3), thereby facilitating alignment of substrates 110. In particular, the alignment over surfaces 112 may be within ±1 µm in the XY plane (i.e., in the plane of surfaces 112), which may facilitate a small pitch for copper nails and pads in TSVs (as described further below in FIGS. 4 and 5).

Note that a given positive feature, such as positive feature 116-1, may include an assembly material other than a bulk material(s) in substrates 110. Therefore, the assembly material may have a bulk modulus that is less than a bulk modulus of substrate 110-1 and/or that is less than a bulk modulus of substrate 110-2. For example, the bulk material in substrates 110 may be a semiconductor (such as silicon) and the assembly material may be: a metal, a metal alloy (such as solder), a polymer and/or a compliant polymer (such as a polymer than can be compressed by more than 1% with a normal force that is significantly less than one that will compress either of substrates 110 by 1%).

In some embodiments, positive features 116 each include an optional core (such as core 118-1) and an optional outer shell (such as outer shell 120-1). This optional outer shell may include the assembly material, while optional core 118-1 may include a material other than the assembly material (such as a less compressible or compliant material than the assembly material). For example, optional core 118-1 may include: sapphire, ruby, glass, a ceramic material, a plastic and/or a metal.

As noted previously, the assembly material may have been, at least in part, sacrificed when the mechanical coupling between substrates 110 was established. For example, the assembly material may have been, at least in part, mechanically compressed and/or melted when the mechanical coupling was established.

In an exemplary embodiment where positive features 116 include optional cores (such as optional core 118-1) and optional outer shells (such as outer shell 120-1), the assembly material in the optional (thin) outer shells may be melted at elevated temperatures during the die attach/bonding technique. This may reduce the total bondline height of MCM 100. Note that accuracy in the XY plane (i.e., in the plane of surfaces 112) may be maintained throughout the assembly process because positive features 116 are positioned or 'sit' in the center of facing negative features 114. As described further below with respect to FIG. 5, reducing the variance in the gap in the Z direction between surfaces 112 may ensure that copper nails and pads associated with TSVs make direct contact, thereby providing layer-to-layer electrical coupling of traces or connectors on substrates 110. Thus, MCM 100, and the assembly technique, can accommodate variance in components (such as the variance in the size of different batches of balls) and/or process variations from wafer-to-wafer (such as the variance in the geometry of the copper nails).

Because defining features, such as negative features 114, in substrates 110 can be expensive, in some embodiments the cost of MCM 100 is reduced by fabricating negative features 114 (and/or positive features 210 and 310 in FIGS. 2 and 3)) in one or more optional dielectric layers 122, which are deposited on substrate 110-1 and/or 110-2. For example, optional dielectric layers 122 may include a polymer or polyimide, and each may be approximately 10 μm thick.

Figure 2:
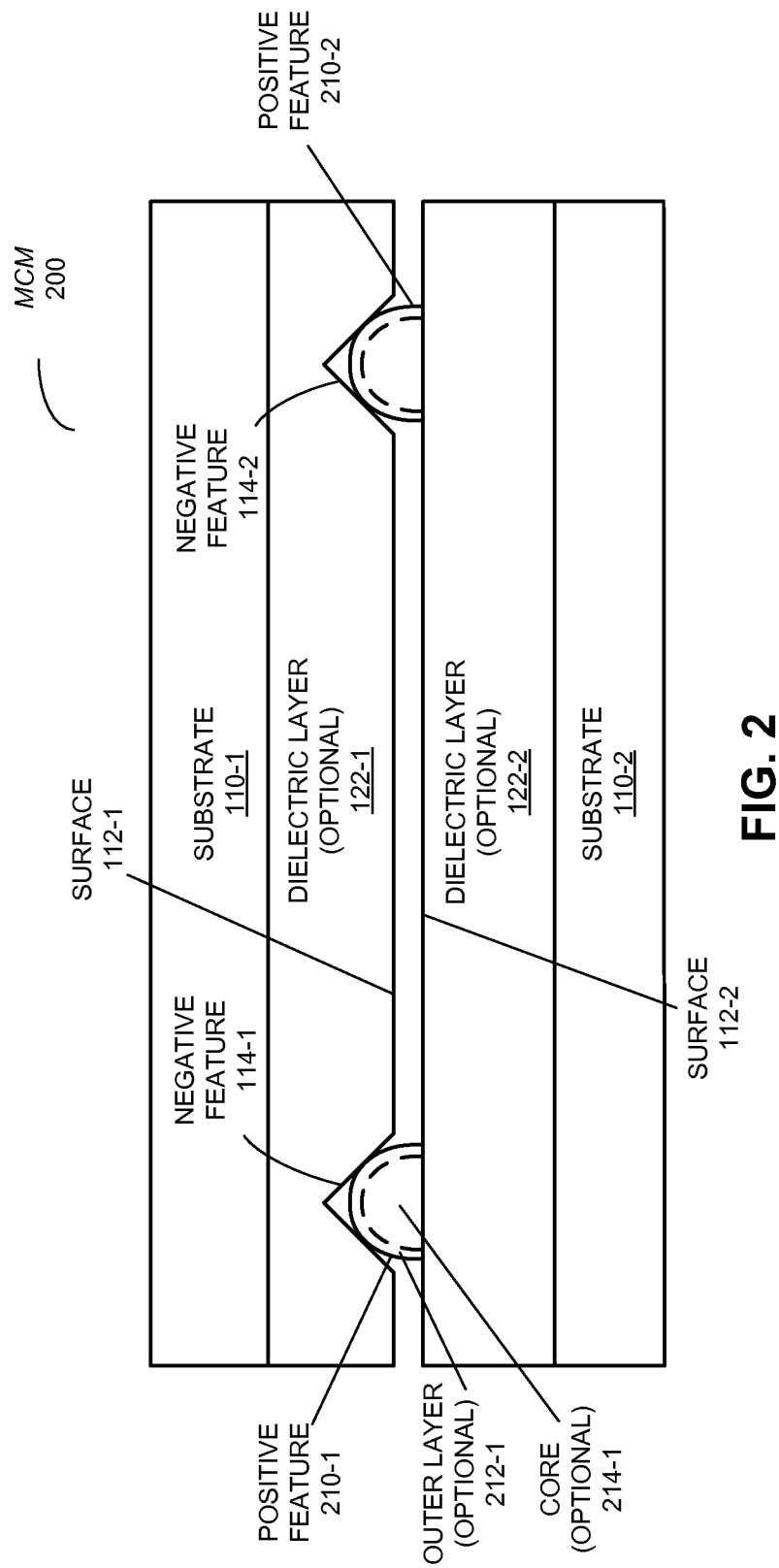
FIG. 2 is a block diagram illustrating an MCM in accordance with an embodiment of the present disclosure.

While FIG. 1 illustrates positive features 116 that were separate from substrates 110 prior to assembly of MCM 100, in other embodiments positive features 116 may be defined in either or both surfaces 112. This is shown in FIG. 2, which presents a block diagram illustrating a cross-sectional view of MCM 200. In this MCM, positive features 210 include protrusions from surface 112-2. Each of positive features 210 may include the assembly material. In some embodiments, a given positive feature, such as positive feature 210-1, includes optional core 212-1 and optional outer layer 214-1. Once again, optional core 212-1 may include a material other than the assembly material (such as a less compressible or compliant material than the assembly material).

Figure 3:
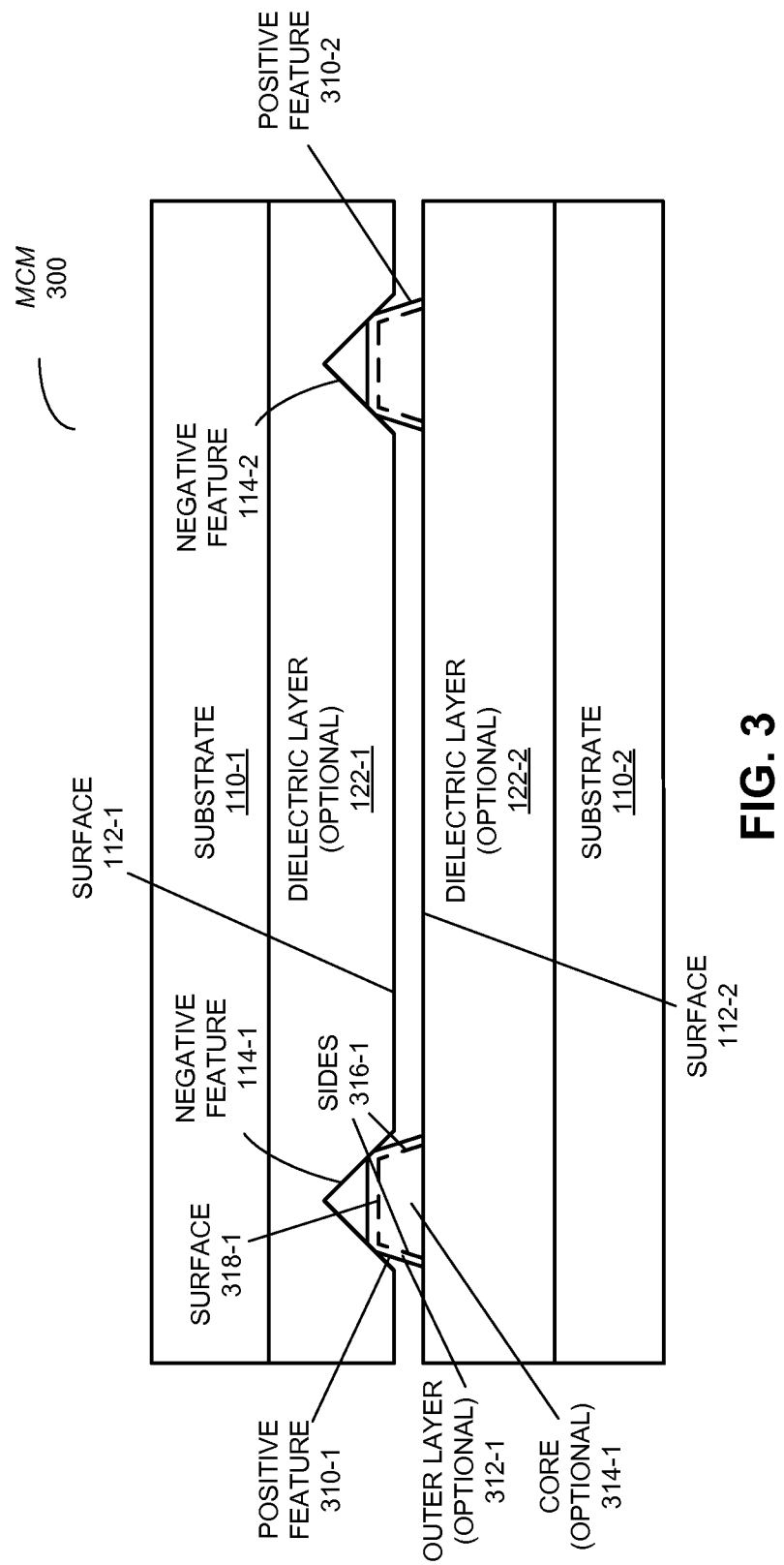
FIG. 3 is a block diagram illustrating an MCM in accordance with an embodiment of the present disclosure.

Instead of a hemispherical shape, in some embodiments the protrusions may resemble a top hat or a pyramidal structure. This is shown in FIG. 3, which presents a block diagram illustrating a cross-sectional view of MCM 300. In particular, positive features 310 include sides (such as sides 316) and upper surfaces (such as surface 318), and the assembly material may be deposited in a layer on sides 316 and/or on surface 318. Thus, a given positive feature, such as positive feature 310-1, may include optional core 312-1 and optional outer layer 314-1. Because the assembly material is compliant, this configuration may facilitate improved alignment in the XY plane.

While FIGS. 2 and 3 illustrate MCMs with positive features disposed on the surface of one substrate and negative features disposed on the surface of the other substrate, in other embodiments there are positive and negative features disposed on the surfaces of each substrate. Once again, these positive and negative features may mate with associated negative and positive features on the other substrates, thereby aligning substrates 110.

We now describe embodiments of a process for assembling an MCM. In an exemplary embodiment, controlled-collapse of a high-accuracy, self-alignment ball-pit system is used to assist TSV die stacking. This ball-pit system provides initial bonding accuracy with excellent self-alignment capability for both XY plane and co-planarity control. Note that the initial contacts between the chips define the positions of the spherical balls. Furthermore, the controlled-collapse of the ball-pit system for TSV bonding provides compliance which addresses the process variance in the ball sizes and the copper-pillar or -nail/copper-pad heights, thereby ensuring rigid copper-nail-to-copper-pad electrical interconnects.

Figure 4:
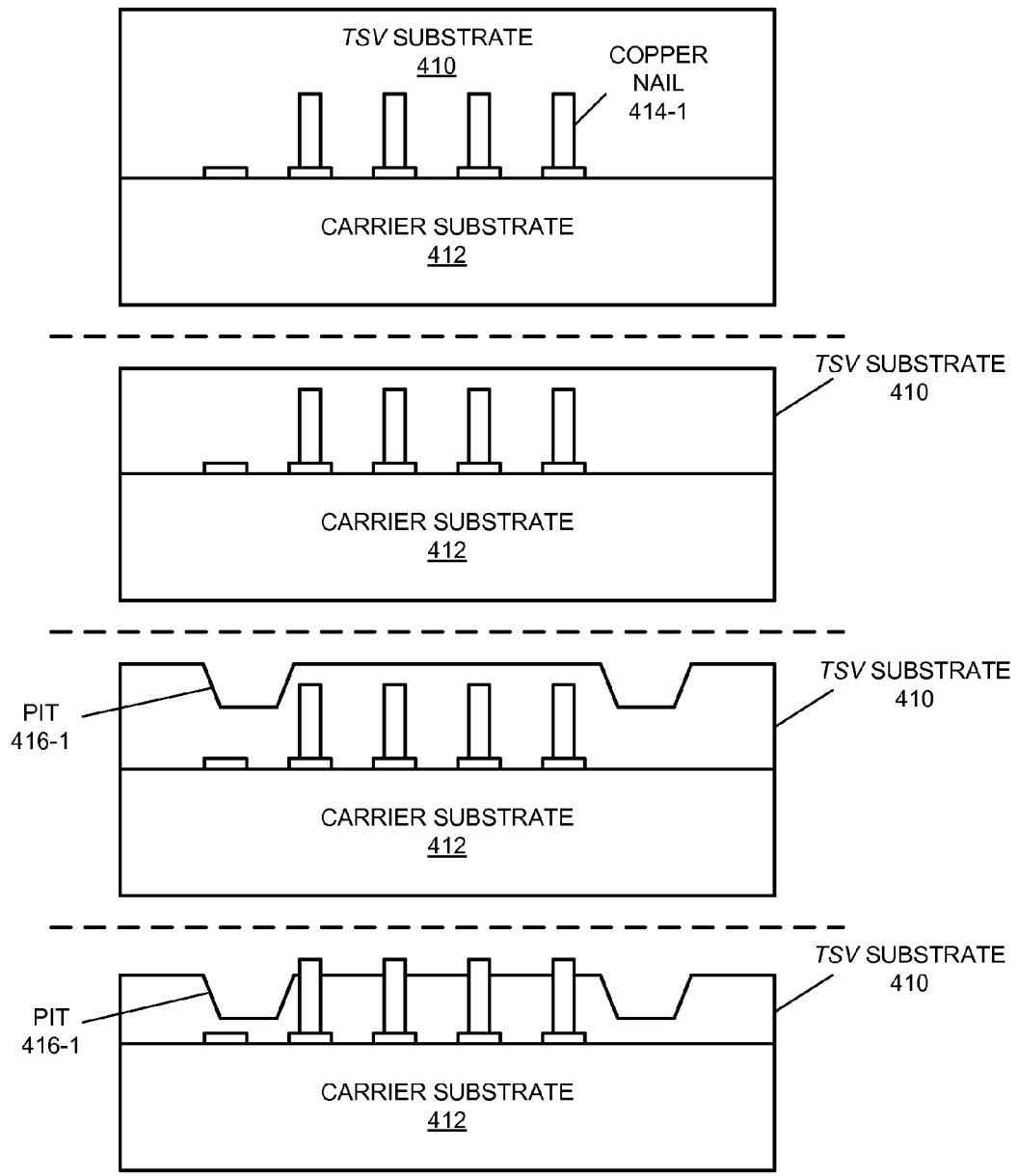
FIG. 4 is a sequence of block diagrams illustrating fabrication of through-silicon vias (TSVs) in accordance with an embodiment of the present disclosure.
Figure 5:
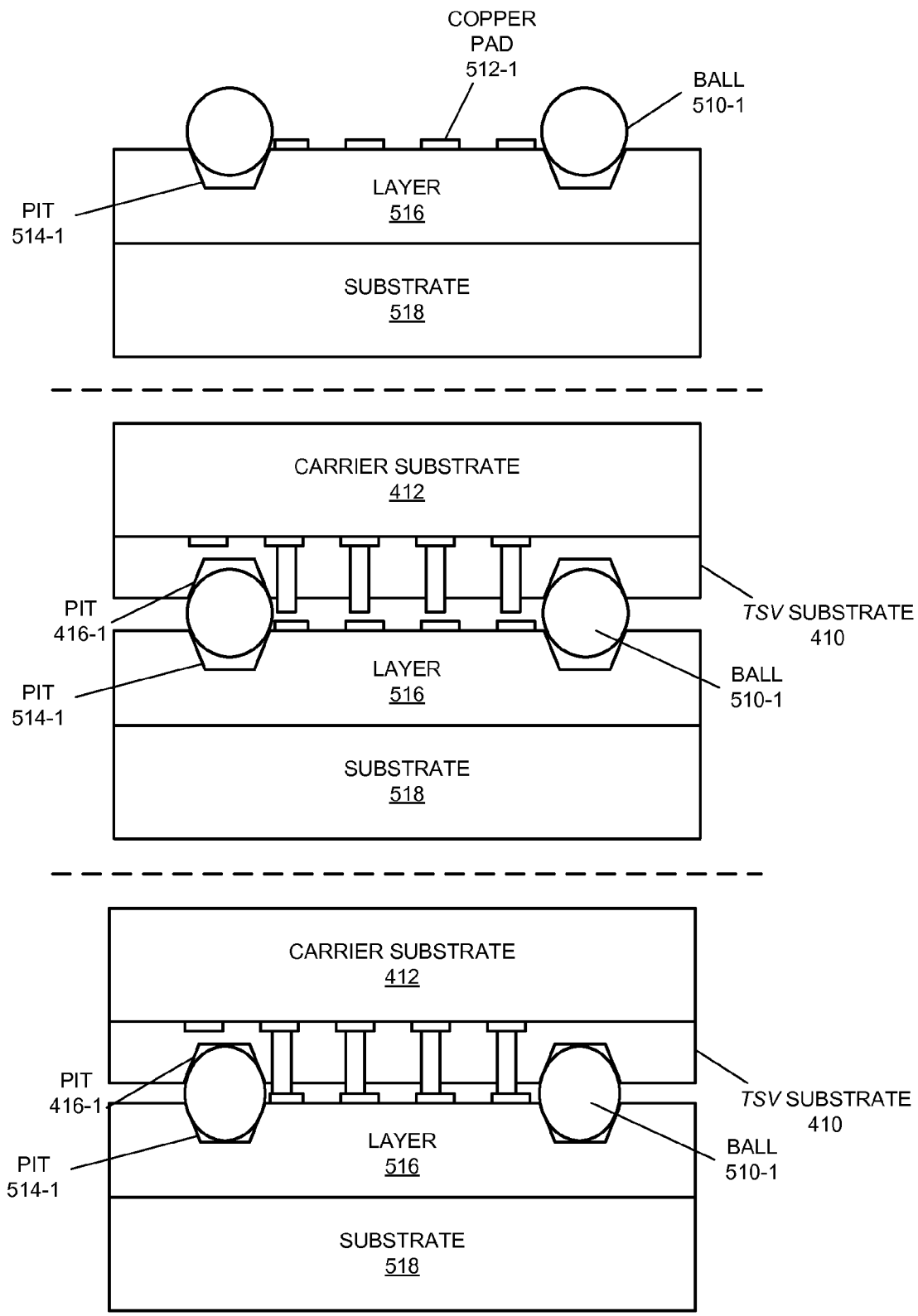
FIG. 5 is a sequence of block diagrams illustrating assembly of an MCM in accordance with an embodiment of the present disclosure.

FIGS. 4 and 5 present a sequence of block diagrams illustrating fabrication of TSVs using a ball-pit assisted bonding process for two substrates in a die stack. In this process, the TSV substrate or wafer thickness is 50 μm, and the ball size is approximately 160 μm (and, more generally, is less than 200 μm). This process includes operations that address challenges in TSV fabrication including: etch pit formation through the backside of the TSV substrate (to accommodate different substrate thicknesses); the use of a compliant plastic ball (such as a polymer), which provides the initial Z alignment accuracy during bonding without presenting a hard mechanical stop; and controlled collapse of a deformable outer shell of solder around the plastic ball to ensure reliable formation of TSV contacts.

Referring to FIG. 4, which illustrates a pitting process on the backside of TSV substrate 410, in a first operation copper nails (such as copper nail 414-1) are defined in TSV substrate 410, and TSV substrate 410 is bonded onto carrier substrate 412 using a temporary bonding adhesive.

Next, TSV substrate 410 is back ground to about 5-10 μm above the embedded copper nails.

Subsequently, pits, such as pit 416-1, are defined on a back surface of TSV substrate 410. For example, a hardmask of nitride may be patterned on the back surface to open silicon wet-etch windows using backside alignment lithography, and a wet etch of the silicon may be used to form the pits.

Additionally, an etch-pit-passivation etch and a silicon-recess etch may be used to expose the copper nails. These copper nails may also be chemically treated to remove oxide.

As an alternative to the TSV process illustrated in FIG. 4, in some embodiments a non-TSV process is used. For example, copper-to-copper bonding in the die stack may be facilitated by defining copper pads on TSV substrate 410, and defining the pits on the same surface using wafer pitting. Moreover, in some embodiments micro-solder is plated onto these copper pads to facilitate copper-to-solder bonding in the die stack.

FIG. 5 presents a sequence of block diagrams illustrating a bonding process during assembly of an MCM. In this example, the balls, such as ball 510-1, used for the alignment each have a spherical core coated with a material that melts at the chip-to-chip bonding temperature (which is typically around 300-350 C for copper-to-copper bonding). For example, this outer shell may be: a low viscosity epoxy, an acryl tic polymer and/or a solder coating. Note that this outer shell provides: a high-accuracy die attachment using a ball-pit self-alignment technique at low temperature or room temperature prior to the formation of copper-nail/copper-pad electrical contacts; and thermal-compression bonding to form the reliable electrical contacts. In some embodiments, these electrical contacts are based on copper-to-copper bonding. Consequently, the ball-pit system may provide easy high-accuracy die attachment, and a process window that reliably achieves TSV electrical contacts even if there is some non-uniformity in the heights of the copper pillars.

In FIG. 5, polymer or solder coated balls (such as ball 510-1) are stencil placed into pits, such as pit 514-1, which are defined in layer 516 on substrate 518. For example, the balls may be placed using an SBM-series wafer-level ball-mounting system from Shibuya Kogyo Company, Ltd. of Ishikawa, Japan.

Then, after dicing, TSV substrate 410 may be die attached to substrate 518 using a high-throughput flip-chip bonder. Note that the ball-pit self-aligning technique is used to achieve high-alignment accuracy. In addition, note that, at this point in the process, electrical contacts between the copper nails and copper pads, such as copper pad 512-1, have not been established yet.

Next, via thermal-compression bonding, at least a portion of the polymer or solder coated outer shells of the balls melts, thereby establishing copper-to-copper metallic contacts. Subsequently, the polymer is cured or the solder is solidified. Additionally, carrier substrate 412 may be removed.

Note that, in order to accommodate different substrate thicknesses, pits in substrate 410 and layer 516 may have different geometries. Moreover, to facilitate compression of the balls, the bulk modulus of assembly material in the balls or the outer shell of the balls may have a bulk modulus that is less than a bulk modulus of the metal connectors in the TSVs (such as the bulk modulus of the copper pads and/or the copper nails).

In some embodiments, the assembly technique and the MCM use small footprint pits and balls. For example, instead of using ball-and-pit structures which are on the order of 100 μm thick, the ball and pit sizes may be on the order of 10 μm. In these embodiments, layer 516 may be a dielectric.

FIG. 6 presents a flow chart illustrating a process 600 for assembling an MCM, such as MCM 100 (FIG. 1), MCM 200 (FIG. 2) and/or MCM 300 (FIG. 3). During this method, a negative feature is defined in at least one of a first surface of a first substrate and a second surface of a second substrate (operation 610). Then, the first substrate and the second substrate are stacked, so that the first surface and the second surface are facing each other (operation 612). Furthermore, while stacking the first substrate and the second substrate, a positive feature in the MCM is positioned relative to the negative feature so that the positive feature, at least in part, mates with the negative feature (operation 614). Note that the positive feature may include a material (such as the assembly material) having a bulk modulus that is less than a bulk modulus of the first substrate and that is less than a bulk modulus of the second substrate. Next, the first substrate and the second substrate are aligned by sacrificing at least a portion of the positive feature (operation 616), where at least the portion of the positive feature includes the material.

In some embodiments, sacrificing at least the portion of the positive feature optionally involves mechanically compressing at least the portion of the positive feature and/or melting at least the portion of the positive feature (operation 618).

Note that process 600, as well as the processes illustrated in FIGS. 4 and 5, may include additional or fewer operations. Moreover, the order of the operations may be changed, and/or two or more operations may be combined into a single operation.

Figure 7:
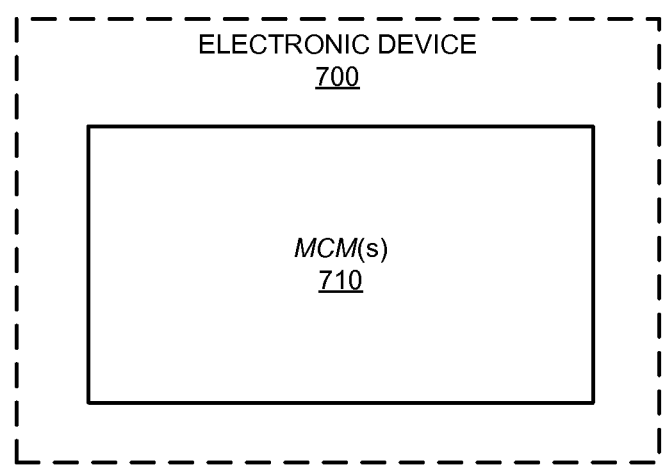
FIG. 7 is a block diagram illustrating an electronic device in accordance with an embodiment of the present disclosure.

While the preceding discussion used TSVs as an illustrative example, the embodiments of the MCM and the assembly technique may be used in a wide variety of applications, such as: a die stack in a memory application, flip-chip bonding and/or multi-layer stacks. A general application of an MCM is shown in FIG. 7, which presents a block diagram illustrating an electronic device 700. This electronic device includes one or more MCMs, such as MCM(s) 710, which may include one or more of the MCMs in the preceding embodiments.

In general, an MCM may include an array of chip modules (CMs) or single-chip modules (SCMs), and a given SCM may include at least one substrate, such as a semiconductor die. Furthermore, the substrate may communicate with other substrates, CMs, SCMs, and/or optical devices in the MCM using proximity communication of electromagnetically coupled signals (which is referred to as 'electromagnetic proximity communication'). For example, the proximity communication may include: communication of capacitively coupled signals ('electrical proximity communication') and/or communication of optical signals ('optical proximity communication'). In some embodiments, the electromagnetic proximity communication includes inductively coupled signals and/or conductively coupled signals.

Furthermore, embodiments of the MCM may be used in a variety of applications, including: VLSI circuits, communication systems (such as in wavelength division multiplexing), storage area networks, data centers, networks (such as local area networks), and/or computer systems (such as multiple processor-core computer systems). For example, an MCM may be included in a backplane that is coupled to multiple processor blades, or an MCM may couple different types of components (such as processors, memory, I/O devices, and/or peripheral devices). In some embodiments, an MCM performs the functions of: a switch, a hub, a bridge, and/or a router.

Note that electronic device 700 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer or computer system may be at one location or may be distributed over multiple, geographically dispersed locations.

MCM 100 (FIG. 1), MCM 200 (FIG. 2), MCM 300 (FIG. 3) and/or electronic device 700 may include fewer components or additional components. For example, an optional dielectric layer (such as optional dielectric layer 122-1 in FIG. 1) may be deposited on only one of the substrates 110 (FIG. 1), such as the one with the contacts (such as the copper pads) for the TSVs.

Furthermore, although the MCMs in FIGS. 1-3 are illustrated as having a number of discrete items, these MCMs are intended to be functional descriptions of the various features that may be present rather than structural schematics of the embodiments described herein. Consequently, in these embodiments two or more components may be combined into a single component, and/or a position of one or more components may be changed.

Note that components in the MCMs in FIGS. 1-3 may be fabricated, and the MCMs may be assembled, using a wide variety of techniques, as is known to one of skill in the art.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A multi-chip module (MCM), comprising:
a first substrate having a first surface; and
a second substrate having a second surface, wherein the first surface is mechanically coupled to the second surface, thereby aligning the first substrate and the second substrate;
wherein the mechanical coupling is facilitated by a negative feature recessed below at least one of the first surface and the second surface, which has an opening, defined by an edge, in at least one of the first surface and the second surface;
wherein the mechanical coupling is facilitated by a positive feature in the MCM that includes a first material other than a bulk material in the first substrate and the second substrate, which at least in part mates with the negative feature, wherein the first material comprises one or more of a metal, a metal alloy, a polymer, or a compliant polymer; and
wherein the positive feature includes a spherically shaped coupling component, wherein the spherically shaped coupling component has a core that includes a second material, and an outer shell that includes the first material, wherein the second material comprises a less compressible or compliant material than the first material.

2. The MCM of claim 1, wherein the first material was, at least in part, sacrificed when the mechanical coupling was established.

3. The MCM of claim 1, wherein the first material was, at least in part, mechanically compressed when the mechanical coupling was established.

4. The MCM of claim 1, wherein the first material was, at least in part, melted when the mechanical coupling was established.

5. The MCM of claim 1, wherein the negative feature is defined in the first surface and the positive feature is defined on the second surface.

6. The MCM of claim 1, wherein, prior to assembly of the MCM, the positive feature was a separate component from the first substrate and the second substrate.

7. The MCM of claim 1, wherein the first surface includes a first negative feature and the second surface includes a second negative feature; and
wherein the positive feature mates with the first negative feature and the second negative feature, thereby facilitating the alignment.

8. The MCM of claim 1, wherein the positive feature includes a protrusion from at least one of the first surface and the second surface;
wherein the protrusion includes a second material, and has sides and an upper surface which is substantially parallel to the first surface and the second surface; and
wherein the protrusion includes a layer, deposited on the upper surface, the sides or both, which includes the first material.

9. The MCM of claim 8, wherein the first material was, at least in part, sacrificed when the mechanical coupling was established.

10. The MCM of claim 8, wherein the first material was, at least in part, mechanically compressed when the mechanical coupling was established.

11. The MCM of claim 8, wherein the first material was, at least in part, melted when the mechanical coupling was established.

12. The MCM of claim 1, wherein the negative feature, the positive feature, or both are defined in a dielectric layer deposited on at least one of the first substrate and the second substrate.

13. The MCM of claim 1, wherein the alignment facilitates electrical coupling of components on the first substrate and the second substrate using a through-silicon via.

14. The MCM of claim 13, wherein the bulk modulus of the first material is less than a bulk modulus of a metal connector in the through-silicon via.

15. An electronic device, comprising at least one MCM, wherein the MCM includes:
a first substrate having a first surface; and
a second substrate having a second surface, wherein the first surface is mechanically coupled to the second surface, thereby aligning the first substrate and the second substrate;
wherein the mechanical coupling is facilitated by a negative feature recessed below at least one of the first surface and the second surface, which has an opening, defined by an edge, in at least one of the first surface and the second surface;
wherein the mechanical coupling is facilitated by a positive feature in the MCM that includes a first material other than a bulk material in the first substrate and the second substrate, which at least in part mates with the negative feature, wherein the first material comprises one or more of a metal, a metal alloy, a polymer, or a compliant polymer; and
wherein the positive feature includes a spherically shaped coupling component, wherein the spherically shaped coupling component has a core that includes a second material, and an outer shell that includes the first material, wherein the second material comprises a less compressible or compliant material than the first material.

16. The MCM of claim 1, wherein the second material comprises one of sapphire or ruby.

17. The MCM of claim 1, wherein the second material comprises one of a glass, a ceramic material, a plastic, or a metal.

* * * * *